(12) United States Patent
Hanya

(10) Patent No.: US 10,431,358 B2
(45) Date of Patent: Oct. 1, 2019

(54) RESISTOR PRODUCTION METHOD, RESISTOR, AND ELECTRONIC DEVICE

(71) Applicant: STANLEY ELECTRIC CO., LTD., Meguro-ku, Tokyo (JP)

(72) Inventor: Akihiko Hanya, Tokyo (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 22 days.

(21) Appl. No.: 15/568,540

(22) PCT Filed: Mar. 23, 2016

(86) PCT No.: PCT/JP2016/059237
§ 371 (c)(1),
(2) Date: Oct. 23, 2017

(87) PCT Pub. No.: WO2016/170900
PCT Pub. Date: Oct. 27, 2016

(65) Prior Publication Data
US 2018/0158580 A1      Jun. 7, 2018

(30) Foreign Application Priority Data
Apr. 24, 2015   (JP) .................. 2015-089839

(51) Int. Cl.
*H01P 11/00*      (2006.01)
*C09D 11/00*      (2014.01)
(Continued)

(52) U.S. Cl.
CPC ............. *H01C 17/065* (2013.01); *H01B 1/22* (2013.01); *H01C 7/003* (2013.01); *H01C 17/22* (2013.01);
(Continued)

(58) Field of Classification Search
CPC ......... H01P 11/00; C09D 11/00; C09D 11/30; H01B 1/02
(Continued)

(56) References Cited

U.S. PATENT DOCUMENTS 5,780,162 A      7/1998   Toyoda et al.
7,294,366 B2 *   11/2007  Renn ...................... H05K 3/125
                                                    427/226
(Continued)

FOREIGN PATENT DOCUMENTS

JP      49121171 A      11/1974
JP      61244094 A      10/1986
(Continued)

OTHER PUBLICATIONS

Related U.S. Appl. No. 15/560,439; First Named Inventor: Akihiko Hanya; Title: "Electronic Device, Method for Producing the Same, and Circuit Substrate"; filed: Sep. 21, 2017.
(Continued)

*Primary Examiner* — Xiaoliang Chen
(74) *Attorney, Agent, or Firm* — Holtz, Holtz & Volek PC

(57) ABSTRACT

A resistor manufacturing method includes a first step of applying a solution wherein conductive nanosized particles with a particle diameter of less than 1 μm and an insulating material are at least dispersed, or a solution wherein the conductive nanosized particles covered with an insulating material layer are at least dispersed, in a desired form on a substrate surface, thereby forming a film. The resistor manufacturing method also includes a second step of irradiating one portion of the film with light in a predetermined pattern, and sintering the conductive nanosized particles with the light, thereby forming a resistive film that is a conductive particle layer of the predetermined pattern.

11 Claims, 7 Drawing Sheets

(51) Int. Cl.

| | | |
|---|---|---|
| *C09D 11/30* | (2014.01) | |
| *H01B 1/02* | (2006.01) | |
| *H01C 17/065* | (2006.01) | |
| *H01C 17/24* | (2006.01) | |
| *H01B 1/22* | (2006.01) | |
| *H01C 7/00* | (2006.01) | |
| *H01C 17/22* | (2006.01) | |
| *H05K 1/16* | (2006.01) | |
| *H05K 1/09* | (2006.01) | |
| *H05K 3/12* | (2006.01) | |

(52) U.S. Cl.
CPC ............. *H01C 17/24* (2013.01); *H05K 1/097* (2013.01); *H05K 1/167* (2013.01); *H05K 3/1283* (2013.01); *H05K 2203/1131* (2013.01)

(58) Field of Classification Search
USPC ..... 361/765; 29/600; 427/58, 125, 180, 212, 427/376.2, 383.1, 402, 532; 428/209, 428/210, 323, 328, 402
See application file for complete search history.

(56) References Cited

U.S. PATENT DOCUMENTS

| | | | | |
|---|---|---|---|---|
| 7,713,350 | B2* | 5/2010 | Yadav | ............... A61L 27/06 106/404 |
| 8,592,814 | B2 | 11/2013 | Yamazaki et al. | |
| 9,812,621 | B2 | 11/2017 | Ishihara et al. | |
| 2003/0108664 | A1* | 6/2003 | Kodas | ............... C09D 11/30 427/125 |
| 2003/0161959 | A1* | 8/2003 | Kodas | ............... C09D 11/30 427/376.2 |
| 2003/0175411 | A1* | 9/2003 | Kodas | ............... C09D 11/30 427/58 |
| 2004/0170820 | A1* | 9/2004 | Yadav | ............... A61L 27/06 428/323 |
| 2004/0180203 | A1* | 9/2004 | Yadav | ............... A61L 27/06 428/402 |
| 2004/0239861 | A1 | 12/2004 | Uchida | |
| 2005/0129383 | A1* | 6/2005 | Renn | ............... B05D 1/02 385/147 |
| 2005/0196711 | A1* | 9/2005 | Shiroguchi | ......... H01L 27/1292 430/330 |
| 2005/0276912 | A1* | 12/2005 | Yamamoto | ........ H01L 21/28008 427/117 |
| 2006/0068080 | A1* | 3/2006 | Yadav | ............... A61L 27/06 427/8 |
| 2006/0097368 | A1 | 5/2006 | Seko | |
| 2006/0159899 | A1* | 7/2006 | Edwards | ................ H05K 1/16 428/209 |
| 2006/0163744 | A1* | 7/2006 | Vanheusden | ........... B82Y 30/00 257/773 |
| 2006/0210705 | A1 | 9/2006 | Itoh et al. | |
| 2007/0019028 | A1* | 1/2007 | Renn | ............... H05K 3/102 347/21 |
| 2007/0104877 | A1* | 5/2007 | Kodas | ............... C09D 11/30 427/375 |
| 2007/0104878 | A1* | 5/2007 | Kodas | ............... C09D 11/30 427/375 |
| 2007/0117271 | A1* | 5/2007 | Kodas | ............... C09D 11/30 438/122 |
| 2007/0122932 | A1* | 5/2007 | Kodas | ............... C09D 11/30 438/57 |
| 2007/0154634 | A1* | 7/2007 | Renn | ............... C03C 17/006 427/180 |
| 2007/0178232 | A1* | 8/2007 | Kodas | ................ H05K 3/046 427/180 |
| 2007/0178616 | A1 | 8/2007 | Arai et al. | |
| 2007/0279182 | A1* | 12/2007 | Kodas | .................. H01C 17/065 338/22 R |
| 2008/0093594 | A1 | 4/2008 | Honda et al. | |
| 2008/0165513 | A1 | 7/2008 | Inoue et al. | |
| 2008/0286488 | A1 | 11/2008 | Li et al. | |
| 2008/0290787 | A1* | 11/2008 | Cok | .................. H01L 51/5203 313/503 |
| 2009/0114922 | A1* | 5/2009 | Shiroguchi | ......... H01L 27/1292 257/72 |
| 2009/0179230 | A1 | 7/2009 | Yamamoto et al. | |
| 2009/0274833 | A1 | 11/2009 | Li et al. | |
| 2010/0000762 | A1 | 1/2010 | Yang et al. | |
| 2010/0003791 | A1 | 1/2010 | Maeda et al. | |
| 2010/0112195 | A1* | 5/2010 | Kodas | ................ H05K 3/046 427/98.4 |
| 2011/0096388 | A1 | 4/2011 | Agrawal et al. | |
| 2011/0207328 | A1* | 8/2011 | Speakman | .......... H01L 51/0011 438/694 |
| 2011/0293851 | A1 | 12/2011 | Bollstroem et al. | |
| 2012/0055013 | A1* | 3/2012 | Finn | ..................... H01Q 1/2225 29/600 |
| 2012/0119200 | A1 | 5/2012 | Ueno et al. | |
| 2014/0138710 | A1 | 5/2014 | Ohtsu et al. | |
| 2014/0191399 | A1 | 7/2014 | Ando et al. | |
| 2014/0327024 | A1 | 11/2014 | Ishihara et al. | |
| 2014/0327844 | A1* | 11/2014 | Hwang | ................... G06F 3/047 349/12 |
| 2014/0374775 | A1 | 12/2014 | Saito et al. | |
| 2015/0028085 | A1 | 1/2015 | Endoh et al. | |
| 2015/0197063 | A1* | 7/2015 | Shinar | ..................... G06F 17/50 700/98 |
| 2016/0205726 | A1* | 7/2016 | Spielmann | ............... H05B 3/12 219/543 |
| 2016/0272488 | A1 | 9/2016 | Ogashiwa et al. | |

FOREIGN PATENT DOCUMENTS

| | | |
|---|---|---|
| JP | 03020907 A | 1/1991 |
| JP | 10199705 A | 7/1998 |
| JP | 2006032916 A | 2/2006 |
| JP | 2006165517 A | 6/2006 |
| JP | 2008153536 A | 7/2008 |
| JP | 2010108696 A | 5/2010 |
| JP | 2011527089 A | 10/2011 |
| JP | 2014017364 A | 1/2014 |
| JP | 2014075461 A | 4/2014 |
| JP | 2014116315 A | 6/2014 |
| WO | 2004103043 A1 | 11/2004 |
| WO | 2013108408 A1 | 7/2013 |

OTHER PUBLICATIONS

Related U.S. Appl. No. 15/560,445; First Named Inventor: Akihiko Hanya; Title: "Method for Prodcuing Electronic Device, and Electronic Device"; filed: Sep. 21, 2017.
International Search Report (ISR) and Written Opinion dated Jun. 7, 2016 issued in International Application No. PCT/JP2016/059237.
U.S. Office Action (Non-Final Rejection) dated Nov. 29, 2018 issued in related U.S. Appl. No. 15/560,439.
English language International Preliminary Report on Patentability dated Nov. 2, 2017 issued in International Application No. PCT/JP2016/059237.

* cited by examiner

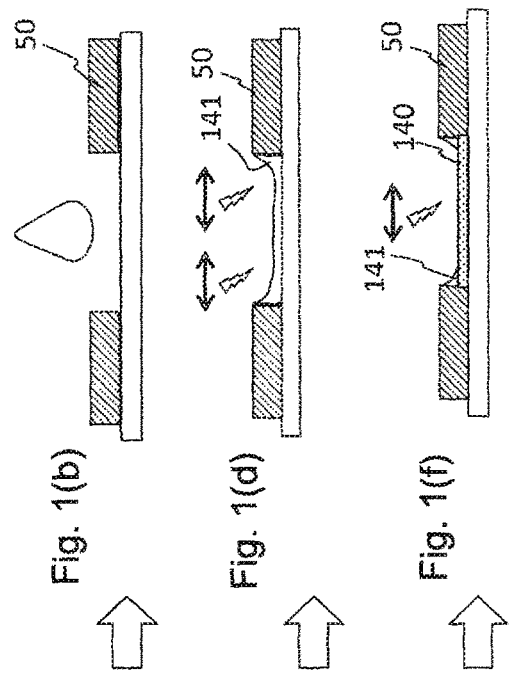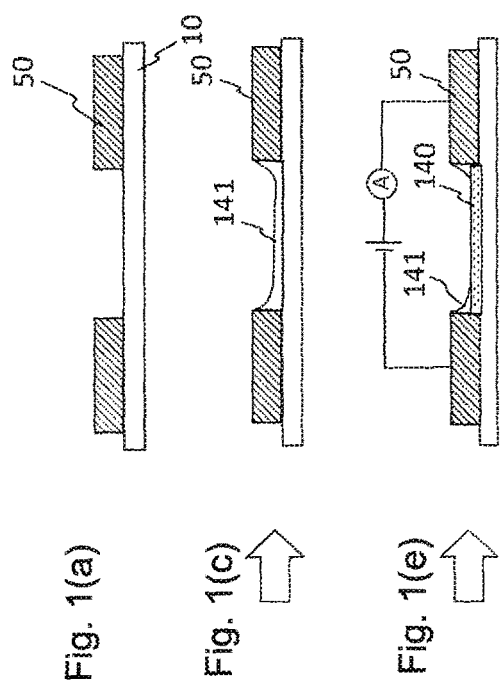

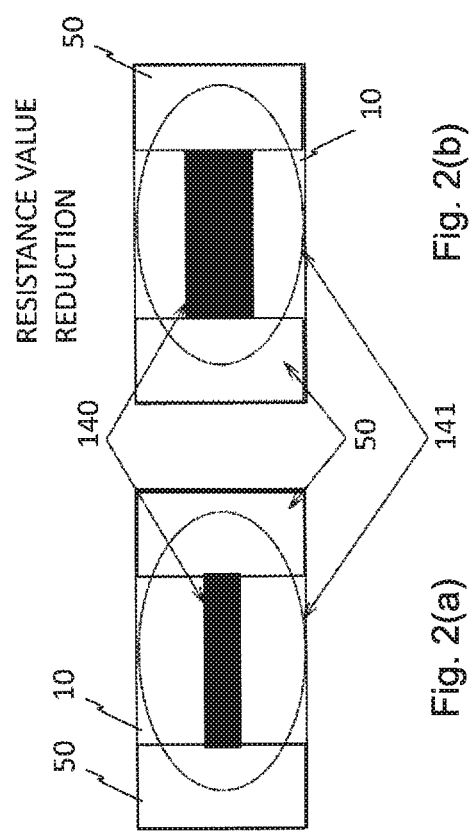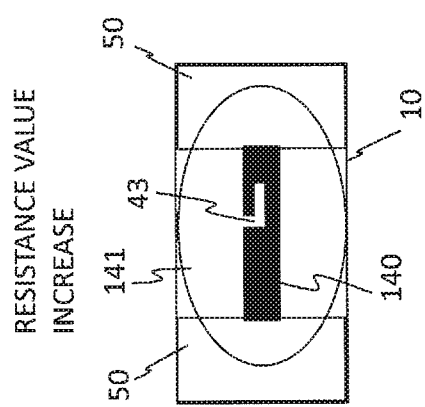

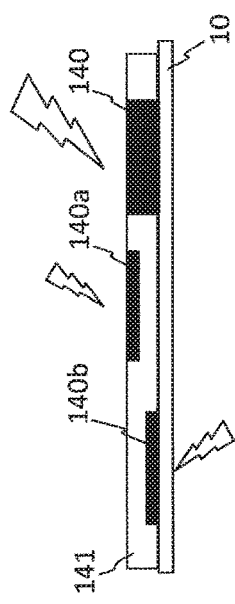
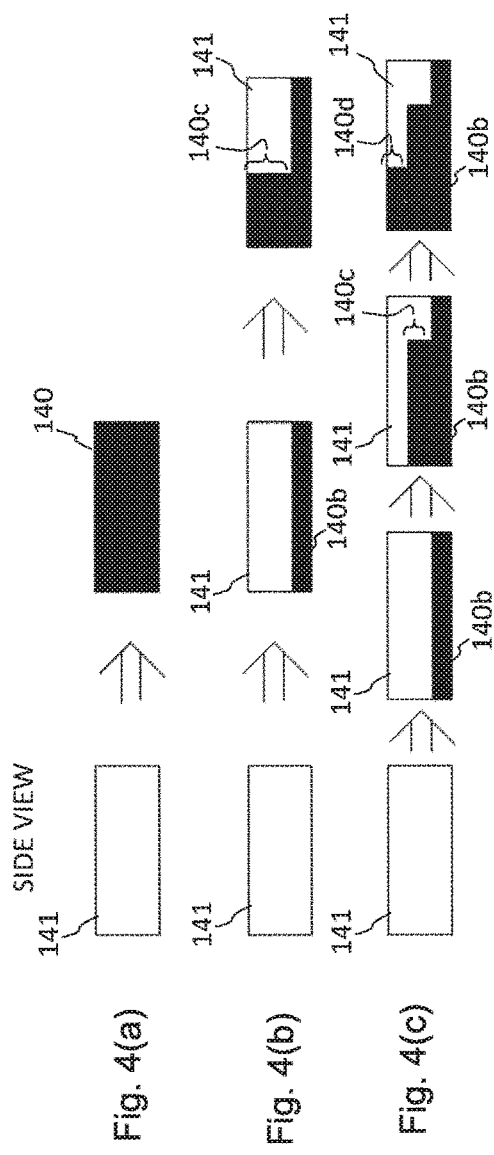

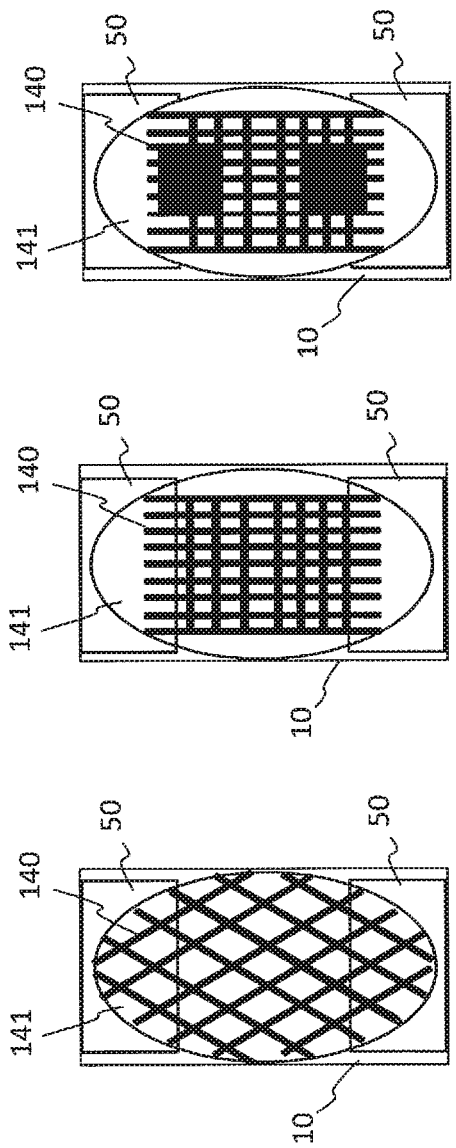

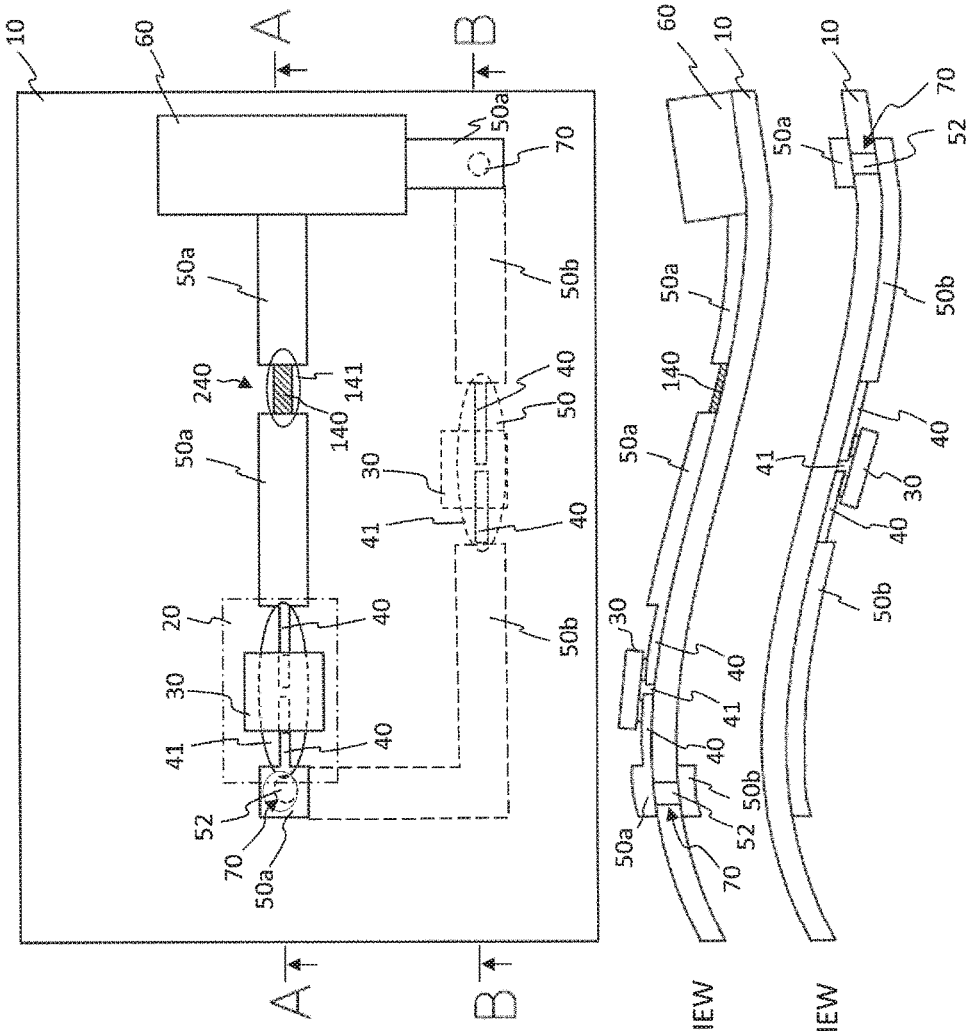

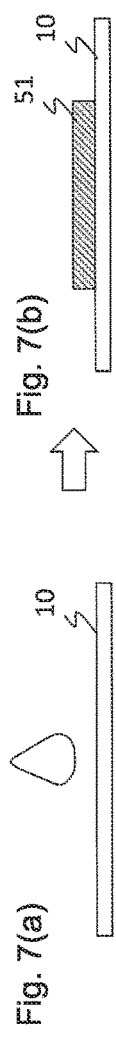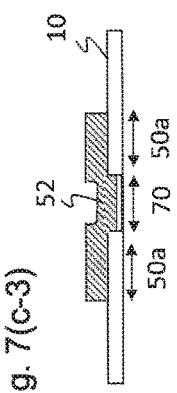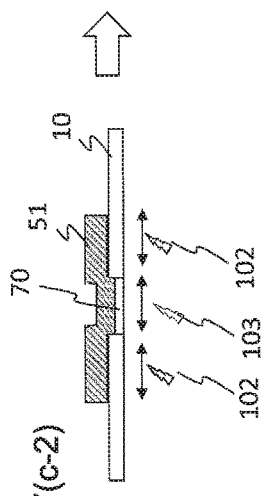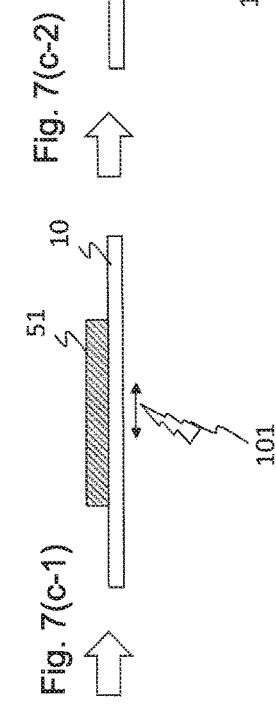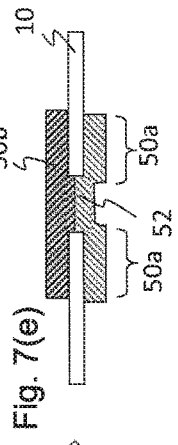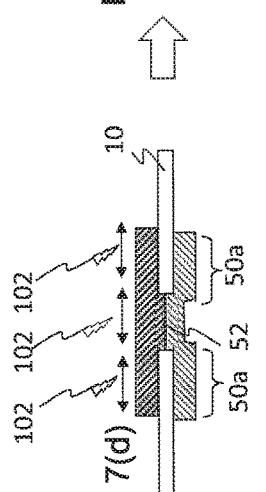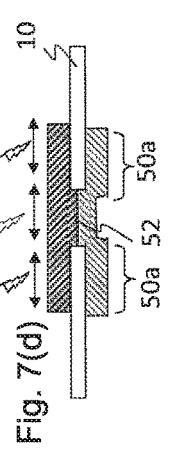

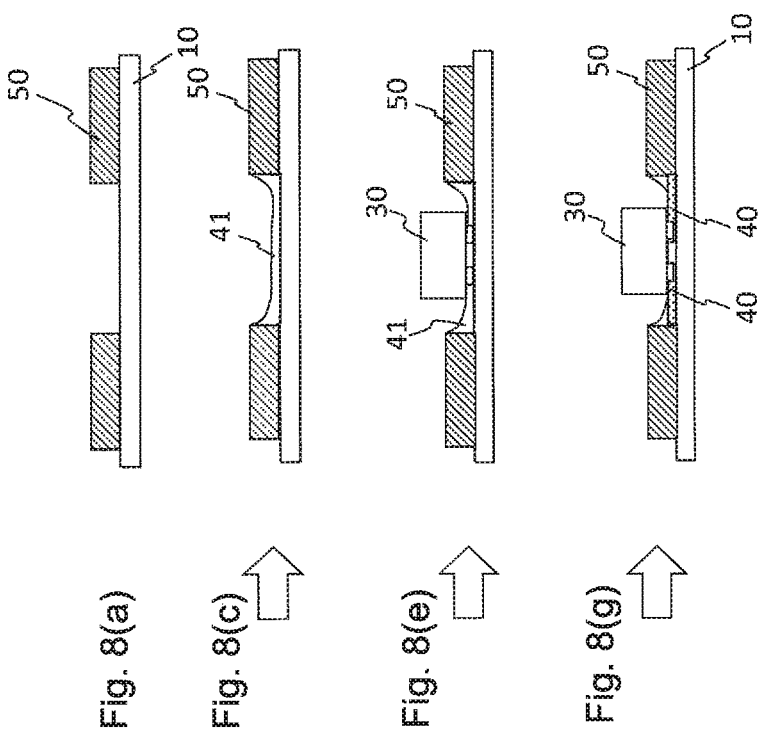

RESISTOR PRODUCTION METHOD, RESISTOR, AND ELECTRONIC DEVICE

TECHNICAL FIELD

The present invention relates to a resistor including a resistive film on a substrate.

BACKGROUND ART

A chip resistor wherein a resistive film and an electrode are mounted on a surface of a substrate, a lead resistor wherein a cylindrical base surface is covered with a resistive film and a lead is connected to either end thereof, and the like, are known as fixed resistors. A carbon film or metal film is used as the resistive film. In a manufacturing process of these resistors, the resistive film is formed using a printing process and a firing process or the like, after which a process of narrowing a current path by trimming one portion of the resistive film using a laser beam or the like is carried out in order to regulate a resistance value of the resistive film.

Meanwhile, a technical field called printed electronics, wherein a circuit pattern is formed by printing, is being actively researched as a circuit pattern manufacturing method in order to simplify a manufacturing process and suppress a manufacturing device cost. For example, technology such that a non-conductive film including copper nanoparticles is deposited using an inkjet printer or the like, and the copper particles are fused by the film formed being irradiated from above with light, thereby forming a conductive circuit, is disclosed in Patent Document 1.

CITATION LIST

Patent Literature

Patent Document 1: JP-A-2014-116315

SUMMARY OF INVENTION

Technical Problem

An existing fixed resistor manufacturing method is such that regulation of a resistance value of a resistive film is carried out by trimming the resistive film, as heretofore described. Although trimming can increase the resistance value, trimming cannot reduce the resistance value. Because of this, the resistive film needs to be formed in the large size in advance in order that the resistance value can be kept within a desired range by trimming, which is an obstacle to reducing a resistor size.

An object of the invention is to provide a fixed resistor manufacturing method such that a resistance value of a resistive film can be regulated by increasing or reducing.

Solution to Problem

In order to achieve the heretofore described object, the invention has a first step of applying a solution wherein conductive nanosized particles with a particle diameter of less than 1 µm and an insulating material are dispersed, or a solution wherein conductive nanosized particles covered with an insulating material layer are dispersed, in a desired form on a substrate surface, thereby forming a film, and a second step of irradiating one portion of the film with light in a predetermined pattern, and sintering the conductive nanosized particles with the light, thereby forming a resistive film that is a conductive nanosized particle layer of the predetermined pattern.

Advantageous Effects of Invention

According to the invention, a fixed resistor manufacturing process is such that not only regulation that increases a resistance value of a resistive film, but also regulation that reduces the resistance value can be carried out.

BRIEF DESCRIPTION OF DRAWINGS

FIG. 1(a) to FIG. 1(f) are sectional views showing a resistor manufacturing process of a first embodiment.

FIG. 2(a) to FIG. 2(c) are top views showing the resistor manufacturing process of the first embodiment.

FIG. 3 is an illustration showing a thickness of a resistive film manufactured in a second embodiment.

FIG. 4(a) is an illustration showing that a resistive film 140 is formed by a film 141 of the first embodiment being irradiated with light, and FIGS. 4(b) and 4(c) are illustrations showing that the resistive film 140 is formed in only one portion in a thickness direction of the film 141 of the second embodiment, and that the resistive film 140 widens in the thickness direction owing to an additional light irradiation.

FIG. 5(a) to FIG. 5(c) are top views showing a reticulated form resistive film 140 of a third embodiment.

FIG. 6(a) is a top view, FIG. 6(b) is an A-A sectional view, and FIG. 6(c) is a B-B sectional view of an electronic device manufactured in a sixth embodiment.

FIG. 7(a) to FIG. 7(e) are sectional views showing an electronic device manufacturing process of the sixth embodiment.

FIG. 8(a) to FIG. 8(g) are sectional views showing the electronic device manufacturing process of the sixth embodiment.

DESCRIPTION OF EMBODIMENTS

A resistor manufacturing method of an embodiment of the invention will be described.

First Embodiment

A resistor manufacturing method of a first embodiment will be described, using FIGS. 1(a) to 1(f) and FIGS. 2(a) to 2(c).

In this embodiment, a film including conductive particles covered with an insulating material layer is formed, a conductive particle layer is formed by one portion of the film being irradiated with light, and the conductive particle layer is employed as a resistive film. A resistance value of the resistive film is measured, and when the resistance value is greater than a desired value, the conductive particle layer is widened by irradiating with additional light, thereby forming an additional resistive film. Meanwhile, when the resistance value is smaller than a desired value, trimming is carried out by irradiating with light. By so doing, regulation of the resistive film resistance value is increased or reduced, whereby a resistive film of a desired value can be formed. Hereafter, a specific description will be given.

Firstly, a substrate 10 on which a pair of circuit patterns (electrodes) 50 are formed in advance is prepared, as in FIG. 1(a).

Next, a solution such that conductive nanosized particles (hereafter called conductive nanoparticles) with a particle diameter (for example, an average particle diameter) of 1 μm or less and an insulating material are at least dispersed in a solvent, or a solution such that conductive nanoparticles covered with an insulating material layer are at least dispersed in a solvent, is applied in a desired form within a region 20 on a surface of the substrate 10, as in FIG. 1(*b*). It is desirable that a surface of the applied solution becomes smooth on the substrate 10, forming a coating film (film 141), as in FIG. 1(*c*). An end portion of the film 141 coincides with an end portion of the circuit pattern 50. The film 141 is heated as necessary, and thereby dried. The conductive nanoparticles are dispersed inside the film 141, and a periphery of the conductive nanoparticles is in a state of being covered with the insulating material. The film 141 in this state is such that a whole thereof is non-conductive.

Next, the film 141 is irradiated with light in a desired pattern, as in FIG. 1(*d*), thereby sintering the conductive nanoparticles with the light, and forming a conductive nanosized particle layer (resistive film 140) of a desired pattern. It is desirable that a region coinciding with the circuit pattern 50 is also irradiated with the light in order to form the resistive film 140 continuously with the circuit pattern 50. Owing to the light irradiation, the conductive nanoparticles melt at a temperature lower than a bulk melting point of a material configuring the particles. The insulating material layer on the periphery of the conductive nanoparticles evaporates or softens owing to the light irradiation. Because of this, the melted conductive nanoparticles fuse directly with neighboring particles, or penetrate the softened insulating material layer and fuse with neighboring particles. Because of this, conductive nanoparticles can be sintered together, and the region irradiated with light forms the electrically conductive resistive film 140. Because of this, the resistive film 140 is formed as in FIG. 1(*e*) and FIG. 2(*a*). Although the conductive nanoparticles after light irradiation are such that particles are combined, the particle form is maintained to an extent. That is, one portion of the conductive nanoparticle form remains in the conductive nanosized particle layer. As no sintering occurs in a region of the film 141 not irradiated with the light, this region remains non-conductive.

Next, the resistance value of the resistive film 140 formed is measured. For example, current is supplied from a power supply to the resistive film 140, and the resistance value obtained by measuring a current value.

When the measured resistance value is greater than a range of a desired resistance value, the non-sintered film 141 in contact with an edge of the resistive film 140 is additionally irradiated with light, and changed to being electrically conductive by the conductive nanoparticles in the region irradiated with the light being sintered, in a process of FIG. 1(*f*). Because of this, the form of the resistive film 140 can be widened as in FIG. 2(*b*), and the resistance value can be reduced. Therefore, the resistance value can be reduced in accordance with the area and form of the region additionally irradiated with the light, and the resistance value of the resistive film 140 can be regulated so as to be within the desired resistance value range.

Meanwhile, when the measured resistance value is smaller than the range of the desired resistance value, one portion of the resistive film 140 is, for example, irradiated with light in order to increase the resistance value in a process of FIG. 1(*f*), and the resistive film 140 in an irradiated portion (trimming portion) 43 is removed as in FIG. 2(*c*), thereby trimming the resistive film 140. The irradiation light is regulated to an intensity such that the resistive film 140 evanesces or is removed. Because of this, the resistance value can be increased in accordance with the trimmed area and form, and the resistance value of the resistive film 140 can be regulated so as to be within the desired resistance value range.

When the resistance value of the resistive film 140 is not brought within the desired resistance value range by the heretofore described processes, the process of either FIG. 1(*d*) or FIG. 1(*f*) can be carried out again.

The non-conductive film 141 may be removed after the resistance value is regulated. For example, the film 141 can be removed by being dissolved in an organic solvent or the like.

According to the heretofore described manufacturing method, a resistor that includes the substrate 10, including the pair of circuit patterns 50, and the resistive film 140 that connects the circuit patterns 50 can be manufactured, as in FIGS. 2(*a*) and 2(*b*). This resistor is such that one portion or a whole of the resistive film 140 is configured of a layer including conductive nanoparticles whose diameter is less than 1 μm.

A thickness of the resistive film 140 can be formed to in the region of 10 nm to 10 μm, and is set here to, for example, a thickness of 1 μm or more. Also, the electrical resistance the resistive film 140 can be formed to, for example, $10^{-4}$ Ω/cm or less. A thickness of the circuit pattern 50 is greater than the thickness of the resistive film 140, as in FIG. 1(*e*).

Any kind of material may be employed as a material of the substrate 10, provided that the material can support the resistive film 140 and circuit pattern 50, at least a surface has an insulating property, and the material can withstand the light irradiation when the resistive film 140 is formed. For example, a polyethylene terephthalate (PET) substrate, a polyethylene naphthalate (PEN) substrate, a glass epoxy substrate, a paper-phenol substrate, a flexible printed substrate, a ceramic substrate, a glass substrate, a metal substrate whose surface is covered with an insulating layer, or the like, can be used. Also, a film-form substrate can also be used as the substrate 10 of this embodiment.

A substrate that allows the light used for irradiation to pass through in the processes of FIGS. 1(*d*) and 1(*f*) can also be used as the material of the substrate 10, in which case the resistive film 140 or film 141 can be irradiated by causing light to pass through the substrate 10 from a back surface side of the substrate 10 in the processes of FIGS. 1(*d*) and 1(*f*).

One or more conductive metals or conductive metal oxides from among Ag, Cu, Au, Pd, ITO, Pt, Fe and the like can be used as a material of the conductive nanoparticles configuring the resistive film 140. The conductive nanoparticles in a non-sintered state include conductive particles with a particle diameter (for example, an average particle diameter) of 0.01 μm to 1 μm.

One or more of a resin such as a styrene resin, epoxy resin, silicone resin, or acrylic resin, as well as an inorganic material such as $SiO_2$, $Al_2O_3$, or $TiO_2$, and an organic and inorganic hybrid material, can be used as an insulating material at least included in the film 141 and covering the conductive nanoparticles. Also, a thickness of the insulating material layer covering the conductive nanoparticles in the film 141 is preferably in the region of 1 nm to 10,000 nm. When the insulating material layer is too thin, the voltage resistance of the non-conductive film 141 decreases.

A thickness of the film 141 formed in the process of FIG. 1(*c*) can be formed to in the region of 10 nm to 10 μm.

A wavelength of the light used for irradiation is such that a wavelength absorbed by the conductive nanoparticles included in the film 141 is selected and used. The light used for irradiation may be any one of ultraviolet, visible, or infrared light. For example, when Ag, Cu, Au, Pd, or the like, is used as the conductive nanoparticles, a visible light of 400 to 600 nm can be used. When the conductive nanoparticles are sintered in the processes of FIGS. 1(d) and 1(f), a light intensity is set to an irradiation intensity such that the insulating material layer evaporates or softens, and conductive nanoparticles fuse and combine. Specifically, the irradiation intensity is set with consideration to the material and particle diameter of the conductive nanoparticles in the film 141, and to the material and thickness of the insulating material layer covering the conductive nanoparticles. Also, when trimming the resistive film 140 in the process of FIG. 1(f), irradiation is carried out using a light of an intensity such that the sintered conductive nanoparticles can be evaporated or removed.

In order to irradiate with light in a predetermined pattern, a method whereby the light is projected through a mask having an aperture of a predetermined pattern can be used. Also, by using a light beam concentrated into an irradiation diameter smaller than the predetermined pattern, and scanning with the light beam in the predetermined pattern on the film 141, irradiation with light can also be carried out in the predetermined pattern only.

An existing method can be used as a method of forming the circuit pattern 50 on the substrate 10. For example, a method whereby patterning in a desired form is carried out by etching after a thin metal film is formed on the substrate 10 can be used. Also, the circuit pattern 50 can also be formed by, after a coating film of the form of the circuit pattern 50 is formed by a solution in which conductive particles are dispersed being printed on the substrate 10, sintering the conductive particles by applying heat only or heat and pressure.

In this embodiment, as heretofore described, the resistive film 140 of a desired pattern can be formed directly by irradiating with light after the film 141 is formed on the substrate 10. Further, by carrying out an additional light irradiation, not only can the resistance value be maximized, but the resistance value can also be reduced. Therefore, resistance value regulation is easy, and a necessary resistance value can be realized easily and with high accuracy. Also, in comparison with an existing manufacturing method whereby a resistive film is formed by printing and sintering, after which the resistance value of the resistive film is kept within a predetermined range by trimming, a manufacturing process is easy, and time required for manufacturing can be shortened. Furthermore, in comparison with the existing manufacturing method whereby the resistance value is regulated only by trimming the resistive film, the manufacturing method of this embodiment is such that there is no need for the resistive film to be formed in the large size, because of which the resistor can be reduced in size.

As heretofore described, a solution such that conductive nanoparticles with a particle diameter of 1 μm or less and an insulating material are dispersed in a solvent, or a solution such that conductive nanoparticles covered with an insulating material layer are dispersed in a solvent, is used as a solution for forming the coating film (film 141) of this embodiment, but conductive microsized particles (called conductive microparticles) with a particle diameter (for example, an average particle diameter) of 1 μm or more can be included in these solutions. Because of this, when the conductive particles are irradiated with light, the conductive nanoparticles melt first and combine with the peripheral conductive microparticles. Therefore, with the conductive nanoparticles as an origin, the conductive microparticles can be sintered by light irradiation at a temperature lower than in a case of a bulk material. By conductive microparticles and conductive nanoparticles being included, a layer with a large thickness can be formed comparatively easily. The same material as for the conductive nanoparticles can be used as a material of the conductive microparticles. That is, conductive microparticles can be arbitrarily included in a solution for forming the coating film 141 in accordance with a target resistance value and resistive film thickness. When microparticles are included in the solution for forming the coating film 141, the resistive film is formed in a state such that one portion of particle forms of the conductive microparticles and conductive nanoparticles remains.

Also, although the insulating material dispersed together with the conductive nanoparticles and conductive microparticles, or the insulating material covering the conductive nanoparticles and conductive microparticles, evaporates when light irradiation that sinters the conductive nanoparticles and conductive microparticles is carried out, the insulating material may be partially left in the resistive film rather than being completely evaporated. By one portion of the insulating material remaining in the resistive film, the resistance value increases commensurately. That is, the resistance value can be regulated by regulating the amount remaining in the resistive film of the insulating material dispersed together with the conductive nanoparticles and conductive microparticles, or the insulating material covering the conductive nanoparticles and conductive microparticles.

Also, the resistance value can be regulated by a powder or particles configured of indium oxide, copper oxide, silver oxide, Cr, C, or the like, being dispersed in a solution as a resistance value regulating member together with the conductive nanoparticles and conductive microparticles. By the powder or particles being dispersed, the resistive film 140 reaches a state wherein the powder or particles intervene in the sintered conductive nanoparticles and conductive microparticles, whereby sintering of the conductive nanoparticles and conductive microparticles is partially inhibited, and the resistance value of the resistive film 140 can be increased in comparison with a film in which there is no dispersal. Nanosized and microsized particles can be used as the powder or particles.

Second Embodiment

A resistor manufacturing method of a second embodiment will be described, using FIG. 3 and FIGS. 4(a) to 4(c).

Processes of the manufacturing method of the second embodiment are basically the same as FIGS. 1(a) to 1(f) of the first embodiment, but when forming the conductive resistive film 140 in the film 141 by irradiating with light to sinter the conductive nanoparticles in the process of FIG. 1(d), the whole of a thickness direction of the film 141 is sintered in the first embodiment (refer to the resistive film 140 of FIG. 3 and to FIG. 4(a)). In the second embodiment, an amount of light with which the film 141 of FIG. 3 is irradiated is set to be weak in at least one region, and only one portion in the thickness direction of the film 141 is sintered, as in resistive films 140a and 140b of FIG. 3 and in FIGS. 4(b) and 4(c). Because of this, the resistive film 140 (140a, 140b) is formed to be thin in a principal plane direction in at least one region.

The resistive film 140a of FIG. 3 is formed by irradiating with light from an upper surface side of the film 141, and sintering only one region on the upper surface side of the film 141. Meanwhile, the resistive film 140b of FIG. 3 is formed by irradiating with light from a lower surface side of the film 141 through the light transmitting substrate 10, and sintering only one region on the lower surface side of the film 141.

By setting the amount of irradiation light on the weak side, and forming the resistive films 140a and 140b by sintering only one region in the thickness direction of the film 141 in this way, the resistive film 140b can be thickened by further sintering a portion 140c of the film 141 continuous with the resistive film 140a in the thickness direction, as in, for example, FIGS. 4(b) and 4(c), when widening the form of the resistive film 140 using an additional light irradiation in the process of FIG. 1(f). Also, the resistive film 140b can also be thickened in three stages by sintering a portion 140d using an additional light irradiation, as in FIG. 4(c).

Because of this, the resistance value of the resistive film 140 can be regulated without changing the form of the resistive film 140a in the principal plane direction. Therefore, all regions in the principal plane direction of the film 141 first applied can be changed to the resistive film 140, and the resistance value can be regulated. Consequently, the film 141 does not need to be formed on the large size, and a smaller resistor can be manufactured. Also, as the resistance value can be regulated without changing the form of the resistive film 140a in the principal plane direction, the same pattern can be adopted for the light irradiation pattern of the process of FIG. 1(d) and the light irradiation pattern of the process of FIG. 1(f), in which case the manufacturing process becomes easier.

When trimming the resistive films 140a and 140b in the process of FIG. 1(f), it is sufficient that, for example, the resistive film 140b is partially evaporated or removed by irradiating with a large amount of light, in the same way as in the process of FIG. 1(f) in the first embodiment.

As other processes are the same as in the first embodiment, a description thereof will be omitted.

Third Embodiment

A resistor manufacturing method of a third embodiment will be described, using FIGS. 5(a)-5(c).

Processes of the manufacturing method of the third embodiment are basically the same as FIGS. 1(a) to 1(f) of the first embodiment, but when forming the conductive resistive film 140 in the film 141 by irradiating with light to sinter in the process of FIG. 1(d), light irradiation is carried out in a reticulated form (lattice form) in the principal plane direction of the film 141. Because of this, the resistive film 140 is formed so that at least one portion is of a reticulated form, as in FIGS. 5(a) to 5(c). As an irradiation method, the resistive film 140 may be formed by scanning in a reticulated form (lattice form) using a light beam whose irradiation diameter is narrowly focused, or by irradiating with light molded into an irradiation pattern of a reticulated form.

When widening the reticulated resistive film 140 in the process of FIG. 1(f), one line is added to the mesh (lattice) by irradiating with a light beam whose irradiation diameter is narrowly focused, or alternatively, an inner region of the mesh (lattice) is irradiated with light, thereby changing the region to a conductive region, as in FIG. 5(c). Because of this, the resistance value of the resistive film 140 can be reduced. Therefore, the resistance value can be precisely controlled.

As other processes are the same as in the first embodiment, a description thereof will be omitted.

Fourth Embodiment

In a fourth embodiment, the circuit pattern 50 of the first embodiment is formed by light irradiation.

In the fourth embodiment, one portion or a whole of the circuit pattern 50 is configured of a layer of sintered conductive particles. In this case, conductive nanoparticles with a particle diameter (for example, an average particle diameter) of less than 1 μm and conductive microsized particles (called conductive microparticles) with a particle diameter (for example, an average particle diameter) of 1 μm or more are preferably used in combination as the conductive particles. Because of this, when the conductive particles are irradiated with light, the conductive nanoparticles melt first and combine with the peripheral conductive microparticles. Therefore, with the conductive nanoparticles as an origin, the conductive microparticles can be sintered by light irradiation at a temperature lower than in a case of a bulk material. By conductive microparticles and conductive nanoparticles being used in combination, a layer with a large thickness can be formed comparatively easily, and moreover, the circuit pattern 50 can be formed by sintering using light irradiation. The same material as for the conductive nanoparticles described in the first embodiment can be used as a material of the conductive nanoparticles and conductive microparticles.

The circuit pattern 50 includes conductive particles with a particle diameter (for example, an average particle diameter) of 1 μm to 100 μm. A width of the circuit pattern 50 can be 10 μm or more, so can be formed to in the region of, for example, 100 μm. The thickness of the circuit pattern 50 can be formed to in the region of 1 μm to 100 μm, for example, in the region of 20 μm. Also, an electrical resistance of the circuit pattern 50 is desirably $10^{-4}$ Ω/cm or less, and a low resistance in the order of $10^{-6}$ Ω/cm or less is particularly desirable.

A manufacturing method will be described. Firstly, the substrate 10 is prepared.

Next, a solution such that conductive nanoparticles, conductive microparticles, and an insulating material are dispersed in a solvent, or a solution such that conductive nanoparticles and conductive microparticles covered with an insulating material layer are dispersed in a solvent, is prepared. An organic solvent or water can be used as the solvent.

The heretofore described solution is applied in a desired form in a region of the surface of the substrate 10 in which the circuit substrate 50 is to be formed. The applied solution forms a coating film. The coating film is heated as necessary, and thereby dried. The conductive nanoparticles and conductive microparticles are dispersed inside the coating film, and a periphery of the particles is in a state of being covered with the insulating material. Therefore, the coating film in this state is non-conductive.

Next, the coating film is irradiated with light in the form of the circuit pattern 50. The conductive nanoparticles are melted by the light at a temperature lower than the conductive microparticles, and neighboring conductive nanoparticles and conductive microparticles fuse. As sintering occurs with the nanoparticles as an origin in this way, sintering can be carried out at a temperature lower than in a case of a bulk material. Also, sintering can also be caused to occur in only a desired region in a thickness direction of the coating film. Because of this, the circuit pattern 50 can be formed to a desired form.

A wavelength of the light with which the coating film is irradiated is such that a wavelength absorbed by the conductive nanoparticles and conductive microparticles included in the coating film is selected and used. A form of the circuit pattern 50 irradiated with light can be formed using a mask having a predetermined aperture. Also, by using a light beam concentrated into an irradiation diameter smaller than a wiring width of the circuit pattern 50, and scanning with the light beam, irradiation with light can also be carried out in the region of the circuit pattern 50 only.

As no sintering occurs in a region of the coating film not irradiated with the light, this region remains non-conductive. The non-sintered non-conductive region of the coating film may be left unchanged, or may be removed in a subsequent process.

Also, the heretofore described manufacturing method is described as a method whereby a coating film is formed in a range wider than a region that is to form the circuit pattern 50, and only the region that is to form the circuit pattern 50 is irradiated with light, but a coating film may also be formed by a solution in which conductive particles are dispersed being printed in the form of the circuit pattern 50 using a printing method. In this case, the circuit pattern 50 can be formed by a whole of the coating film formed by printing being irradiated with light.

After the circuit pattern 50 is formed using the heretofore described process, the resistive film 140 is formed by carrying out the manufacturing process of the first embodiment, thereby manufacturing the resistor.

Fifth Embodiment

In the fourth embodiment, the manufacturing method of the first embodiment is implemented after the circuit pattern 50 is formed on the substrate 10, but a fifth embodiment is such that after implementing as far as forming a coating film that is to form the circuit pattern 50 in accordance with the fourth embodiment, the manufacturing method of the first embodiment is implemented as far as FIG. 1(c), without carrying out light irradiation, thereby forming as far as the film 141 that is to form the resistive film 140.

Further, photosintering of the circuit pattern 50 and resistive film 140 is carried out consecutively or simultaneously. Note that the region that is to form the circuit pattern 50 is irradiated with light of a wavelength absorbed by the conductive particles of the coating film of the circuit pattern 50, and the region that is to form the resistive film 140 is irradiated with light of a wavelength absorbed by the conductive nanoparticles of the film 141. Also, the intensities of the lights used for irradiation are regulated to intensities that can cause sintering in the circuit pattern 50 and resistive film 140 respectively.

Subsequently, the manufacturing method of the first embodiment is implemented, thereby completing the resistor.

By sintering being carried out consecutively or simultaneously by the circuit pattern 50 and resistive film 140 being irradiated with light in this way, light irradiation processes in the whole of the manufacturing process can be carried out at one time, because of which manufacturing efficiency improves.

In this embodiment, the order of forming the coating film of the circuit pattern 50 and forming the film 141 of the resistive film 140 may be reversed, and the coating film of the circuit pattern 50 formed after forming the film 141 of the resistive film 140. Subsequently, light irradiation of the two circuit patterns is carried out consecutively or simultaneously.

Also, the manufacturing method of the fourth embodiment is such that the order of the circuit pattern 50 formation process and resistive film 140 formation process may be reversed, and the circuit pattern 50 formed after forming the resistive film 140.

Sixth Embodiment

As a sixth embodiment of the invention, an electronic device in which the resistor of the first embodiment is used will be described, using FIGS. 6(a)-6(c).

An electronic device of FIGS. 6(a)-6(c) includes the substrate 10 including second circuit patterns 50a and 50b (hereafter also called a second circuit pattern 50), an electronic part 30, and a resistor 240 connected in series to the electronic part 30 by the second circuit pattern 50, the electronic part 30 and resistor 240 being mounted on the substrate 10. The resistor 240 is a resistor having the structure of the first embodiment, and acts as protective resistance that prevents an excessive current from flowing into the electronic part 30.

One portion 50a of the second circuit pattern 50 is mounted on one face of the substrate 10, and the other portion 50b is mounted on the other face of the substrate 10. The second circuit pattern 50a and second circuit pattern 50b coincide in one portion in the principal plane direction of the substrate 10, a through hole 70 is formed in the substrate 10 in the coinciding portion, and the through hole 70 is filled with a conductor 52. Because of this, the second circuit pattern 50a on one face of the substrate 10 and the second circuit pattern 50b on the other face are connected in the thickness direction of the substrate 10 by the conductor 52 inside the through hole 70.

The electronic part 30 is disposed in the region 20 provided on the substrate 10. A first circuit pattern 40 electrically connected to the electronic part 30 is disposed in the region 20. The second circuit pattern 50a is connected to the first circuit pattern 40 in a peripheral edge portion of the region 20. The second circuit pattern 50a is connected to a power supply 60 disposed on an outer side of the region 20, and supplies current to the first circuit pattern 40.

The resistor 240 includes the resistive film 140. The resistive film 140 is disposed in a gap provided partway along the second circuit pattern 50, and connects the second circuit pattern 50 on either side of the gap. The non-conductive film 141 is included in a periphery of the resistive film 140. The film 141 may be removed.

One portion or a whole of the first circuit pattern 40 is configured of a layer of sintered conductive nanoparticles with a particle diameter of less than 1 μm. At least one pair of the first circuit pattern 40 are disposed in the region 20 for mounting the electronic part 30, and connected one each to the second circuit pattern 50 (50a, 50b) on either side of the region 20. A non-conductive layer 41 is disposed between the pair of first circuit patterns 40. The electronic part 30 is flip-chip mounted directly on the pair of first circuit patterns 40. Although the non-conductive layer 41 is disposed between the first circuit patterns 40 in FIGS. 6(a) and 6(b), the non-conductive layer 41 need not necessarily be disposed, and may be removed.

A thickness of the second circuit pattern 50 (50a, 50b) is greater than a thickness of the first circuit pattern 40, as in FIG. 6(b). As the first circuit pattern 40 is formed by sintering conductive nanoparticles, the first circuit pattern 40 is difficult to form thickly, and when the first circuit pattern 40 is formed extended as far as the power supply 60, electrical resistance of the thin first circuit pattern 40 increases. Because of this, it is difficult to supply a large current to the electronic part 30. In this embodiment, only the inside of the region 20 in which the electronic part 30 is mounted, for which fine wiring is needed, is formed of the first circuit pattern 40, while the outer side of the region 20 is configured of the thick second circuit pattern 50, whereby the electrical resistance is reduced in comparison with when the first circuit pattern 40 is formed as far as the power supply 60, enabling a supply of a large current to the electronic part 30.

Also, one portion or a whole of the second circuit pattern 50 can also be configured of a layer of conductive particles sintered by light irradiation, as in the fourth embodiment.

Although the power supply 60 is mounted on the substrate 10 in FIG. 6(a)-6(c), the power supply 60 need not necessarily be mounted on the substrate 10. For example, a connector may be disposed on the substrate 10 instead of the power supply 60. In this case, a power supply not mounted on the substrate 10 can be connected to the connector via a cable or the like. The connector is connected to the second circuit pattern 50. Also, a power generating device such as a photovoltaic cell can also be used as the power supply 60.

The substrate 10 can also be of a curved form, as in FIGS. 6(b) and 6(c). In this case, the first circuit pattern 40 and second circuit pattern 50 are disposed along a surface of the curved substrate 10. In this embodiment, the resistive film 140, first circuit pattern 40, and second circuit pattern 50 can be formed by applying a film including conductive particles, and sintering the film using light irradiation, because of which the resistive film 140 and first and second circuit patterns 40 and 50 on the curved substrate 10 can be formed easily, with no wire cutting or thinning, by curving the substrate 10 before the sintering process.

In particular, the resistive film 140 contracts when the curving process is implemented after the sintering process, because of which the resistance value of the resistive film changes, and the role as a protective circuit declines, but by implementing the sintering process after the curving process, the desired resistance value can be obtained.

The same material as in the first embodiment can be used as the material of the substrate 10. The same material and size as those of the particles for forming the resistive film 140 described in the first embodiment can be used as the material and size of the conductive nanoparticles configuring the first circuit pattern 40. When forming the second circuit pattern 50 by sintering conductive particles, the same particles as in the fourth embodiment can be used.

Any kind of part can be used as the electronic part 30, but as examples, a light emitting element (LED, LD), a light receiving element, an integrated circuit, or a display element (liquid crystal display, plasma display, EL display, or the like) can be used. Also, although only one electronic part 30 is mounted on the substrate 10 in FIGS. 6(a)-6(c), two or more regions 20 can, of course, be provided, and two or more electronic parts 30 mounted. In this case, the second circuit pattern 50 is formed so that a multiple of electronic parts 30 are connected in a desired circuit pattern, such as in series or parallel.

Next, a method of manufacturing the electronic device of FIGS. 6(a)-6(c) will be described, using FIGS. 7(a)-7(e) and FIGS. 8(a)-8(g). FIGS. 7(a) to 7(e) show processes of forming the through hole 70 and second circuit pattern 50 in and on the substrate 10, and FIGS. 8(a) to 8(g) show processes of forming the first circuit pattern 40 in the region 20 on the substrate 10, and mounting the electronic part 30.

Hereafter, a description will be given of an electronic device manufacturing method such that the resistive film 140, the conductor 52 of the through hole 70, and the second circuit pattern 50 are formed of a layer including conductive nanoparticles and conductive microparticles, and one portion or the whole of the first circuit pattern 40 is configured of a layer including conductive nanoparticles with a particle diameter of less than 1 μm.

Firstly, a transparent substrate is prepared as the substrate 10. A solution such that conductive nanoparticles, conductive microparticles, and an insulating material are dispersed in a solvent, or a solution such that conductive nanoparticles and conductive microparticles covered with an insulating material layer are dispersed in a solvent, is applied to one face of the substrate 10, and a film 51 for forming the second circuit pattern and the film 141 for forming the resistive film 140 are formed simultaneously (FIGS. 7(a) and 7(b); the film 141 is not shown in FIGS. 7(a)-7(e)).

Next, a predetermined position is irradiated with light from a face of the substrate 10 on a side opposite to that of the film 51, as in FIG. 7(c-1), and the through hole 70 is opened in the substrate 10 by a light 101. By the through hole 70 being formed, one portion of the film 51 flows into the through hole 70, filling the through hole 70 (FIG. 7(c-2)). At this time, the film 51 fills the through hole 70 more easily when in an undried liquid state, because of which the through hole 70 is preferably formed with the solution left undried after application.

Regions of the films 51 and 141 in which the second circuit pattern 50a and resistive film 140 of FIGS. 6(a)-6(c) are to be formed, and the inside of the through hole 70, are irradiated with lights 102 and 103 respectively (FIG. 7(c-2)). Irradiation with the light 103, with which the film 51 that has flowed into the through hole 70 is irradiated, is carried out at an intensity weaker than that of the light 101, with which irradiation is carried out when forming the through hole 70.

Owing to the irradiation with the lights 102, 103, and the like, the conductive nanoparticles configuring the films 51 and 141 melt at a temperature lower than a bulk melting point of the material configuring the particles, and the insulating material layer on the periphery of the conductive nanoparticles evaporates or softens owing to the light irradiation. The melted conductive nanoparticles combine with the peripheral conductive microparticles, because of which, with the conductive nanoparticles as an origin, the conductive microparticles can be sintered by light irradiation at a temperature lower than in a case of a bulk material. Because of this, the resistive film 140 and second circuit pattern 50a can be formed by sintering the conductive nanoparticles and conductive microparticles of the regions irradiated with the light 102 and the like. Also, the conductor 52 filling the inside of the through hole 70 can be formed by sintering the conductive nanoparticles and conductive microparticles of the film 51 inside the through hole 70 with the light 103 (FIG. 7(c-3)).

As no sintering occurs in regions of the films 51 and 141 not irradiated with the lights 102, 103, and the like, these regions remain non-conductive. The non-sintered non-conductive regions of the film 51 and film 141 may be left unchanged, or may be removed.

Next, regulation of the resistance value of the resistive film 140 is subsequently carried out by carrying out the processes of FIGS. 2(b) and 2(c) described in the first embodiment.

Continuing, the film 51 is formed on the other face of the substrate 10 by the same processes as in FIGS. 7(*a*) and 7(*b*) being carried out, and the film 51 is sintered by irradiating with the light 102, thereby forming the second circuit pattern 50*b* on the other face of the substrate 10 (FIG. 7(*c*-4)). By the second circuit pattern 50*b* being formed so as to cover the position of the through hole 70 at this time, the second circuit pattern 50*a* on the one face and the second circuit pattern 50*b* on the other face can be joined by the conductor 52 inside the through hole 70. Also, when the conductor 52 formed from the one face side of the substrate 10 does not fill the whole of the interior of the through hole 70, the conductor 52 can be formed to eventually fill all of the interior of the through hole 70 by forming the film 51 over the through hole 70 from the other face side of the substrate 10 in the process of FIG. 7(*c*-4).

An existing method can be used as a method of forming the second circuit patterns 50*a* and 50*b*. For example, the second circuit patterns 50*a* and 50*b* can be formed by patterning being carried out by etching in the forms of the second circuit patterns 50*a* and 50*b* of FIGS. 6(*a*)-6(*c*) after a thin metal film is formed on the substrate 10.

Next, a solution such that conductive nanoparticles and an insulating material are dispersed in a solvent, or a solution such that the conductive nanoparticles covered with a layer of the insulating material are dispersed in a solvent, is prepared in order to form the first circuit pattern 40, as described in the first embodiment.

The solution is applied in the region 20 (FIG. 8(*b*)) of the substrate 10 including the second circuit pattern 50 (50*a*, 50*b*) (FIG. 8(*a*)) formed by the heretofore described process. A surface of the applied solution becomes smooth on the substrate 10, forming a coating film (a film 41), as in FIG. 8(*c*). An end portion of the film 41 coincides with an end portion of the second circuit pattern 50. The film 41 is heated as necessary, and thereby dried. The conductive nanoparticles are dispersed inside the film 41, and a periphery of the conductive nanoparticles is in a state of being covered with the insulating material.

Continuing, the electronic part 30 is mounted by being positioned in a predetermined position on the film 41, as in FIG. 8(*d*), and an electrode 31 of the electronic part 30 is caused to adhere to the film 41, as in FIG. 8(*e*).

Next, the film 41 is irradiated with light in the form of the first circuit pattern 40 of FIG. 6(*a*) from the back face side of the substrate, as in FIG. 8(*f*), and the conductive nanoparticles are sintered by the light. Because of this, a pair of first circuit patterns 40 are formed in the region 20, as in FIG. 8(*g*). Although the irradiation with light of the film 41 is carried out from the back face side of the substrate 10, the irradiation with light of the films 51 and 141 may be carried out from either the front face side or the back face side of the substrate.

A wavelength of the light used for irradiation being a wavelength absorbed by the conductive nanoparticles included in the film 41, a wavelength such that there is little absorption in the substrate 10 is selected and used. The light used for irradiation may be any one of ultraviolet, visible, or infrared light. For example, when Ag, Cu, Au, Pd, or the like, is used as the conductive nanoparticles, a visible light of 400 to 600 nm can be used.

An irradiation pattern of the light with which the film 41 is irradiated includes a region of the film 41 with which the electrode 31 of the electronic part is brought into contact. The position in which the electrode 31 of the electronic part is mounted is confirmed, and the irradiation pattern can be determined with the position of the electrode 31 as a reference, because of which positional deviation between the circuit pattern and electronic part can be restricted. In order to form the first circuit pattern 40 continuous with the second circuit pattern 50, a region coinciding with the second circuit pattern 50 is also irradiated with the light. Owing to the light irradiation, the conductive nanoparticles melt at a temperature lower than a bulk melting point of the material configuring the particles. The insulating material layer on the periphery of the conductive nanoparticles evaporates or softens owing to the light irradiation. Because of this, the melted conductive nanoparticles fuse directly with neighboring particles, or penetrate the softened insulating material layer and fuse with neighboring particles. Because of this, conductive nanoparticles can be sintered together, and the region irradiated with light forms the electrically conductive first circuit pattern 40. Although the conductive nanoparticles after light irradiation are such that particles are combined, the particle form is maintained to an extent.

Subsequently, the non-sintered film 41 may be removed.

According to the heretofore described process, the fine first circuit pattern 40 of a desired pattern can be formed by easy processes, those being coating and light irradiation.

Also, as the conductive nanoparticles melt when sintered, the conductive nanoparticles combine with the electrode 31 of the electronic part 30, and the first circuit pattern 40 and electrode 31 can be bonded. That is, the electrode 31 is joined directly to the first circuit pattern 40, without using a bump or the like. This manufacturing method is such that light irradiation is carried out with the electronic part 30 in a mounted state, because of which light irradiation can be carried out in a pattern that has the position of the electrode 31 after mounting as a reference. Because of this, joining of the electrode 31 of the electronic part 30 and the first circuit pattern 40 is obtained with reliably high accuracy.

When a solution such that conductive nanoparticles and an insulating material are dispersed in a solvent, or a solution such that the conductive nanoparticles covered with a layer of the insulating material are dispersed in a solvent, is applied to the substrate 10 in the process of FIG. 8(*b*), the film 41 may be formed using a printing method. Inkjet printing, flexographic printing, gravure offset printing, or the like, can be used as the printing method. In this case, the first circuit pattern 40 can be formed by a whole of the film 41 formed by printing being irradiated with light and sintered in the process of FIG. 8(*d*). Also, the films 51 and 141 formed in the processes of FIGS. 7(*a*) and 7(*b*) and FIGS. 8(*a*) and 8(*b*) can also be formed by printing in the same way.

When curving the substrate 10 as in FIGS. 6(*b*) and 6(*c*), the substrate 10 is desirably curved before the first light irradiation process (FIG. 7(*c*-2)). By so doing, wire cutting and wire thinning of the resistive film 140 and first circuit pattern 40 can be prevented.

In the sixth embodiment, light irradiation is carried out from the back face side of the film 41 using a light transmitting substrate, but light irradiation can also be carried out from above the film 41, using a non-transmitting substrate as the substrate 10. In this case, a bump 42, solder ball, or the like, is mounted as necessary on the first circuit pattern after the first circuit pattern 40 is formed by the film 41 being irradiated with light, and the electronic part 30 is mounted by positioning so that the electrode 31 thereof coincides on the first circuit pattern 40. When a bump or the like is disposed, positioning is carried out so that the position of the bump coincides with the position of the electrode 31 of the electronic part 30. Subsequently, the electrode 31 of the electronic part 30 is connected to the first circuit pattern 40 by heating or ultrasonic wave irradiation, thereby fixing the electronic part 30.

In the sixth embodiment, the film 141 that forms the resistor 240 is formed with the same coating solution as the film 51 that forms the second circuit pattern 50, but a coating solution of a combination differing from that of the coating solution of the film 51 that forms the second circuit pattern 50 can also be used by further including an insulating material in the coating solution configuring the film 141 that forms the resistor 240, or the like. Because of this, the resistance value of the film 141 configuring the resistor 240 can easily be regulated. Also, the film 141 that forms the resistor 240 can be formed with the same coating solution as the film 41 that forms the first circuit pattern 40, or formed with a coating solution of a differing combination by further including an insulating material in the coating solution that forms the first circuit pattern 40, or the like.

According to this embodiment, various kinds of electronic part are mounted collectively in a small number of manufacturing processes, while being mounted to a high density on the substrate 10, whereby the electronic device can be manufactured. Moreover, a circuit pattern can easily be changed by light irradiation, because of which a design change can be responded to easily.

Also, according to this embodiment, as heretofore described, a method of manufacturing an electronic device including a through hole filled with a conductor is also provided as follows. That is, in a first process, a solution wherein conductive nanosized particles with a particle diameter of less than 1 μm, conductive microsized particles with a particle diameter of 1 μm or more, and an insulating material are dispersed, or a solution wherein conductive nanosized particles and the conductive microsized particles, each covered with an insulating material layer, are dispersed, is applied in a desired form on a surface of a substrate, thereby forming a film including the conductive nanosized particles and conductive microsized particles covered with the insulating material layer. In a second process, the inside of the through hole is filled with the conductor. The second process has a process 2-1 in which a predetermined position is irradiated with light from a face of the substrate on a side opposite to that of the film, the through hole is opened in the substrate by the light, and one portion of the film is caused to flow into the through hole, filling the through hole with the film, and a process 2-2 in which the conductive nanosized particles and conductive microsized particles of the film inside the through hole are sintered by light irradiation, thereby forming the conductor.

Also, according to this embodiment, as heretofore described, a method of manufacturing a circuit substrate having a curved substrate is also provided as follows. That is, in a first process, a solution wherein conductive nanosized particles with a particle diameter of less than 1 μm and an insulating material are dispersed, or a solution wherein the conductive nanosized particles covered with an insulating material layer are dispersed, is applied in a desired form on a substrate surface, thereby forming a film including the conductive nanosized particles covered with the insulating material layer. In a second process, the film is irradiated with light in a predetermined pattern, and the conductive nanosized particles are sintered by the light, thereby forming a first circuit pattern, which is a conductive nanosized particle layer of the predetermined pattern. A process of curving the substrate is further carried out before the first process, or after the first process and before the second process.

The electronic device of this embodiment is applicable to any kind of electronic device, provided that the electronic device is a device wherein an electronic part is mounted on a substrate. For example, the electronic device is applicable to an automobile instrument panel, game machine display unit, or the like. Also, as the substrate can be curved, the electronic device is applicable to a wearable electronic device (spectacles, a watch, a display, a medical instrument, and the like), and to a curved display.

The invention claimed is:

1. A method of manufacturing a resistor including (i) a substrate, and (ii) a resistive film provided on the substrate, wherein one portion or a whole of the resistive film is configured of a layer of sintered conductive nanosized particles with a particle diameter of less than 1 μm, the method comprising:
   a first step of applying a solution wherein at least the conductive nanosized particles with a particle diameter of less than 1 μm and an insulating material are dispersed, or a solution wherein at least the conductive nanosized particles covered with an insulating material layer are dispersed, in a desired form on a surface of the substrate, thereby forming a film;
   a second step of irradiating one portion of the film with light in a predetermined pattern, and sintering the conductive nanosized particles with the light, thereby forming the resistive film, which is a conductive particle layer of the predetermined pattern;
   a third step of measuring a resistance value of the resistive film; and
   a fourth step of sintering the conductive nanosized particles by irradiating the film with light, thereby forming an additional resistive film, when the measured resistance value is greater than a range of a desired resistance value, and irradiating the resistive film with light, thereby trimming the resistive film, when the measured resistance value is smaller than the range of the desired resistance value.

2. The method according to claim 1, wherein:
   in the first step, conductive microsized particles are included in the solution, and
   the conductive microsized particles are included in the conductive particle layer.

3. The method according to claim 1, wherein:
   in the first step, the solution includes at least one resistance value regulating member of indium oxide, copper oxide, silver oxide, Cr and C, and
   the resistance value regulating member is included in the resistive film.

4. The method according to claim 1, wherein, in the fourth step, a region in which a thickness of the resistive film is less than a thickness of the film is irradiated with light, thereby widening the resistive film in a thickness direction.

5. The method according to claim 1, wherein, in the second step, at least one region of the film is irradiated with light in a reticulated form in a principal plane direction of the film, thereby forming the resistive film wherein at least one portion is of a reticulated form.

6. The method according to claim 1, further comprising a fifth step of forming a circuit pattern continuous with the resistive film on the substrate surface, wherein the circuit pattern is formed to be thicker than the resistive film.

7. The method according to claim 6, wherein the fifth step comprises:
   a step 5-1 of applying a solution wherein at least the conductive nanosized particles with a particle diameter of less than 1 μm, conductive microsized particles with a particle diameter of 1 µm or more, and the insulating material are dispersed, or a solution wherein at least the conductive nanosized particles and the conductive microsized particles, each covered with an insulating material layer, are dispersed, in a desired form on a surface of the substrate so that an end portion is connected with at least the film, thereby forming a second film; and a step 5-2 of irradiating the second film with light in a predetermined pattern, and sintering the conductive nanosized particles and the conductive microsized particles with the light, thereby forming the circuit pattern.

8. A method of manufacturing a resistor including (i) a substrate, and (ii) a resistive film provided on the substrate, wherein one portion or a whole of the resistive film is configured of a layer of sintered conductive nanosized particles with a particle diameter of less than 1 µm, the method comprising:

a first step of applying a solution wherein at least the conductive nanosized particles with a particle diameter of less than 1 µm and an insulating material are dispersed, or a solution wherein at least the conductive nanosized particles covered with an insulating material layer are dispersed, in a desired form on a surface of the substrate, thereby forming a film; and a second step of irradiating one portion of the film with light in a predetermined pattern, and sintering the conductive nanosized particles with the light, thereby forming the resistive film, which is a conductive particle layer of the predetermined pattern;

wherein, when the conductive nanosized particles are sintered by the light in the second step, only one portion of the conductive nanosized particles are sintered in a thickness direction of the film, thereby forming the resistive film wherein a film thickness in at least one region is smaller than a thickness of the film.

9. An electronic device comprising:

a substrate;

a region for mounting an electronic part provided on the substrate;

a first circuit pattern disposed in the region and electrically connected to the electronic part;

a second circuit pattern connected to the first circuit pattern and supplying current from outside of the region to the first circuit pattern;

a resistor including (i) a substrate, and (ii) a resistive film provided on the substrate, wherein one portion or a whole of the resistive film is configured of a layer of sintered conductive nanosized particles with a particle diameter of less than 1 µm, the resistor being disposed partway along the second circuit pattern; and an electronic part mounted in the region and connected to the first circuit pattern, wherein the second circuit pattern is thicker than the resistive film of the resistor and first circuit pattern.

10. The electronic device according to claim 9, wherein the resistive film of the resistor includes a non-conductive layer continuous with the layer of sintered conductive nanosized particles, and the non-conductive layer includes conductive nanosized particles covered with an insulating film.

11. The electronic device according to claim 9, wherein the layer of sintered conductive nanosized particles of the resistive film of the resistor is formed in a predetermined pattern in a thickness direction.

* * * * *